United States Patent
Nakada (10) Patent No.: US 11,380,831 B2
(45) Date of Patent: Jul. 5, 2022

(54) THERMOELECTRIC CONVERSION MATERIAL, THERMOELECTRIC CONVERSION ELEMENT, THERMOELECTRIC CONVERSION MODULE, AND METHOD FOR MANUFACTURING THERMOELECTRIC CONVERSION

(71) Applicant: MITSUBISHI MATERIALS CORPORATION, Tokyo (JP)

(72) Inventor: Yoshinobu Nakada, Ageo (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/975,268

(22) PCT Filed: Feb. 27, 2019

(86) PCT No.: PCT/JP2019/007563
§ 371 (c)(1),
(2) Date: Aug. 24, 2020

(87) PCT Pub. No.: WO2019/168029
PCT Pub. Date: Sep. 6, 2019

(65) Prior Publication Data
US 2020/0411742 A1 Dec. 31, 2020

(30) Foreign Application Priority Data
Feb. 27, 2018 (JP) .............................. JP2018-033664
Feb. 12, 2019 (JP) .............................. JP2019-022732

(51) Int. Cl.
*H01L 35/14* (2006.01)
*H01L 35/32* (2006.01)
(Continued)

(52) U.S. Cl.
CPC .............. *H01L 35/14* (2013.01); *C01B 33/06* (2013.01); *H01L 35/32* (2013.01); *H01L 35/34* (2013.01);
(Continued)

(58) Field of Classification Search
CPC .......... H01L 35/14; H01L 35/32; H01L 35/34
See application file for complete search history.

(56) References Cited

U.S. PATENT DOCUMENTS

| | | | |
|---|---|---|---|
| 2016/0064638 A1* | 3/2016 | Salvador | H01L 35/325 136/230 |
| 2016/0072033 A1* | 3/2016 | Carberry | H01L 35/20 252/512 |

(Continued)

FOREIGN PATENT DOCUMENTS

| | | |
|---|---|---|
| EP | 3422428 A1 | 1/2019 |
| JP | 2005133202 * | 5/2005 |

(Continued)

OTHER PUBLICATIONS

International Search Report dated Apr. 9, 2019, issued for PCT/JP2019/007563 and English translation thereof.

(Continued)

*Primary Examiner* — Jayne L Mershon
(74) *Attorney, Agent, or Firm* — Locke Lord LLP; James E. Armstrong, IV; Nicholas J. DiCeglie, Jr.

(57) ABSTRACT

A thermoelectric conversion material consists of a non-doped sintered body of a magnesium-based compound, in which an electric resistance value is $1.0 \times 10^{-4}$ Ω·m or less. The magnesium-based compound is preferably one or more selected from a MgSi-based compound, a MgSn-based compound, a MgSiSn-based compound, and a MgSiGe-based compound.

8 Claims, 2 Drawing Sheets

(51) Int. Cl.
  *H01L 35/34*   (2006.01)
  *C01B 33/06*   (2006.01)
(52) U.S. Cl.
  CPC ...... *C01P 2006/32* (2013.01); *C01P 2006/40* (2013.01)

(56) References Cited

U.S. PATENT DOCUMENTS

2017/0301845 A1* 10/2017 Tada .......................... B22F 5/00
2019/0103536 A1*  4/2019 Nakada ................... H01L 35/08

FOREIGN PATENT DOCUMENTS

| JP | 2009-188368 A | | 8/2009 |
| JP | 2013-179322 A | | 9/2013 |
| JP | 2017-152691 A | | 8/2017 |
| JP | WO2017164217 | * | 9/2017 |
| JP | 2019-012828 A | | 1/2019 |
| WO | 16/052272 A1 | | 4/2016 |
| WO | 2018/012369 A1 | | 1/2018 |

OTHER PUBLICATIONS

Supplementary European Search Report dated Nov. 18, 2021, issued for European Patent Application No. 19761165.0.

* cited by examiner

FIG. 3 ature difference between one surface and the other surface side. Therefore, it is preferable that the thermoelectric conversion material has a low thermal conductivity.

THERMOELECTRIC CONVERSION MATERIAL, THERMOELECTRIC CONVERSION ELEMENT, THERMOELECTRIC CONVERSION MODULE, AND METHOD FOR MANUFACTURING THERMOELECTRIC CONVERSION

TECHNICAL FIELD

The present invention relates to a thermoelectric conversion material including a sintered body of a magnesium-based compound, a thermoelectric conversion element including the thermoelectric conversion material, a thermoelectric conversion module, and a method for manufacturing a thermoelectric conversion material.

Priority is claimed on Japanese Patent Application No. 2018-033664, filed Feb. 27, 2018 and Japanese Patent Application No. 2019-022732, filed Feb. 12, 2019, the contents of which are incorporated herein by reference.

BACKGROUND ART

A thermoelectric conversion element formed of a thermoelectric conversion material is an electronic element capable of mutually converting heat and electricity, as in Seebeck effect and Peltier effect. The Seebeck effect is an effect of converting heat energy into electric energy, and is a phenomenon in which an electromotive force is generated when a temperature difference is generated between both ends of a thermoelectric conversion material. Such an electromotive force depends on characteristics of the thermoelectric conversion material. In recent years, thermoelectric power generation utilizing the effect is actively developed. The thermoelectric conversion element described above has a structure in which electrodes are formed on one end and the other end of the thermoelectric conversion material, respectively.

As an index representing a property of the thermoelectric conversion element (thermoelectric conversion material), for example, a power factor (PF) represented by Equation (1) below or a dimensionless performance index (ZT) represented by Equation (2) below is used. In the thermoelectric conversion material, it is necessary to maintain a temperature difference between one surface and the other surface side. Therefore, it is preferable that the thermoelectric conversion material has a low thermal conductivity.

$$PF = S^2 \sigma \quad (1)$$

S: Seebeck coefficient (V/K), σ: Electric conductivity (S/m)

$$ZT = S^2 \sigma T/\kappa \quad (2)$$

T=Absolute temperature (K), κ=Thermal conductivity (W/(m×K))

Here, as the thermoelectric conversion material described above, for example, as shown in Patent Documents 1 and 2, a material obtained by adding various dopants to magnesium silicide is proposed. The thermoelectric conversion materials including magnesium silicide shown in Patent Documents 1 and 2 are manufactured by sintering a raw material powder adjusted to have a predetermined composition.

CITATION LIST

Patent Document

Patent Document 1
Japanese Unexamined Patent Application, First Publication No. 2013-179322

Patent Document 2
Japanese Unexamined Patent Application, First Publication No. 2017-152691

SUMMARY OF INVENTION

Technical Problem

Here, elements such as Sb and Bi which are used as a dopant in the thermoelectric conversion material correspond to, for example, chemical substances designated by chemical substance management Act on promotion (PRTR law) or the like. Therefore, it was necessary to strictly manage the elements, and handling thereof was very complicated. In addition, there is a concern that other dopant elements such as Al may deteriorate by oxidation or the like of the dopant elements. Therefore, handling thereof was complicated as well and there was a problem such as oxidation during manufacturing.

However, when adding no dopant element, the magnesium silicide does not stable and does not have low resistance, and generally has a very high electric resistance and a large variation in electric resistance depending on manufacturing conditions. In addition, electric resistance thereof fluctuates greatly at a temperatures range of low to medium temperatures which are important for the thermoelectric conversion material. Therefore, the magnesium silicide could not be used as a thermoelectric conversion material.

The present invention was made in view of circumstances described above, and an object of the present invention is to provide a thermoelectric conversion material that can suppress an electric resistance value to be low without adding a dopant element complicated to handle and is excellent in a thermoelectric property, a thermoelectric conversion element using the same, a thermoelectric conversion module, and a method for manufacturing the thermoelectric conversion material.

Solution to Problem

In order to solve the problems described above, a thermoelectric conversion material of the present invention consists of a non-doped sintered body of a magnesium-based compound, in which an electric resistance value is $1.0 \times 10^{-4}$ Ω·m or less.

The thermoelectric conversion material consisting of the non-doped sintered body of the magnesium-based compound of the present invention is a thermoelectric conversion material having a high power factor (PF) and a dimensionless figure of merit (ZT), in which an electric resistance value is lowered to $1.0 \times 10^{-4}$ Ω·m without intentionally adding a dopant of a metal element such as Sb, Bi, or Al. In addition, the thermoelectric conversion material of the present invention is excellent in a thermoelectric property particularly in a relatively low temperature region from room temperature to about 300° C.

Here, in the thermoelectric conversion material of the present invention, the magnesium-based compound is preferably one or more selected from a MgSi-based compound, a MgSn-based compound, a MgSiSn-based compound, and a MgSiGe-based compound.

In this case, since the magnesium-based compound is one or more selected from the MgSi-based compound, the MgSn-based compound, the MgSiSn-based compound, and the MgSiGe-based compound, a thermoelectric conversion material further excellent in the thermoelectric property can be obtained.

In addition, the thermoelectric conversion material of the present invention is n-type.

In this case, an n-type thermoelectric conversion material can be obtained without intentionally adding the dopant of the metal element such as Sb, Bi, or Al which is difficult to handle.

A thermoelectric conversion element of the present invention includes the thermoelectric conversion material described above, and electrodes respectively joined to one surface of the thermoelectric conversion material and the other surface opposite the one surface.

According to the thermoelectric conversion element with this configuration, since the thermoelectric conversion element includes the thermoelectric conversion material described above, a thermoelectric conversion element excellent in a thermoelectric property can be obtained.

A thermoelectric conversion module of the present invention includes the thermoelectric conversion element described above, and terminals respectively joined to the electrodes of the thermoelectric conversion element.

According to the thermoelectric conversion module with this configuration, since the thermoelectric conversion module includes the thermoelectric conversion element including the thermoelectric conversion material described above, a thermoelectric conversion module excellent in a thermoelectric property can be obtained.

A method for manufacturing the thermoelectric conversion material described above includes a sintering raw material powder forming step of mixing a silicon oxide powder with a non-doped magnesium-based compound powder to obtain a sintering raw material powder, and a sintering step of heating the sintering raw material powder while applying pressure to form a sintered body.

According to the method with this configuration for manufacturing the thermoelectric conversion material, the sintering raw material powder forming step of mixing the silicon oxide powder with the non-doped magnesium-based compound powder, that is, with the magnesium-based compound powder to which a dopant is not added intentionally, to obtain the sintering raw material powder. Therefore, the electric resistance value of the sintered body of the magnesium-based compound can be suppressed to be low by adding a silicon oxide, even without adding a dopant element. Accordingly, the thermoelectric conversion material described above can be manufactured.

In addition, since the silicon oxide is a chemically stable substance, it is easy to handle the silicon oxide during manufacturing, and the thermoelectric conversion material can be efficiently manufactured.

Here, in the method for manufacturing the thermoelectric conversion material of the present invention, an addition amount of the silicon oxide powder in the sintering raw material powder forming step is preferably in a range of 0.1 mass % or more and 10.0 mass % or less.

In this case, since the addition amount of the silicon oxide powder is in the range of 0.1 mass % or more and 10.0 mass % or less, the electric resistance value of the sintered body of the magnesium-based compound can be reliably reduced.

Advantageous Effects of Invention

According to the present invention, it is possible to provide a thermoelectric conversion material that can suppress an electric resistance value to be low without adding a dopant element complicated to handle and is excellent in a thermoelectric property, a thermoelectric conversion element using the same, a thermoelectric conversion module, and a method for manufacturing the thermoelectric conversion material.

DESCRIPTION OF EMBODIMENTS

Hereinafter, a thermoelectric conversion material according to an embodiment of the present invention, a thermoelectric conversion element, a thermoelectric conversion module, and a method for manufacturing a thermoelectric conversion material will be described with reference to the accompanying drawings.

Each embodiment to be described below is specifically described for better understanding of the gist of the invention, and does not limit the present invention unless otherwise specified. In addition, in the drawings used in the following description, for convenience, in order to make the features of the present invention easy to understand, a portion that is a main part may be enlarged in some cases, and a dimensional ratio or the like of each component is not always the same as an actual one.

Figure 1:
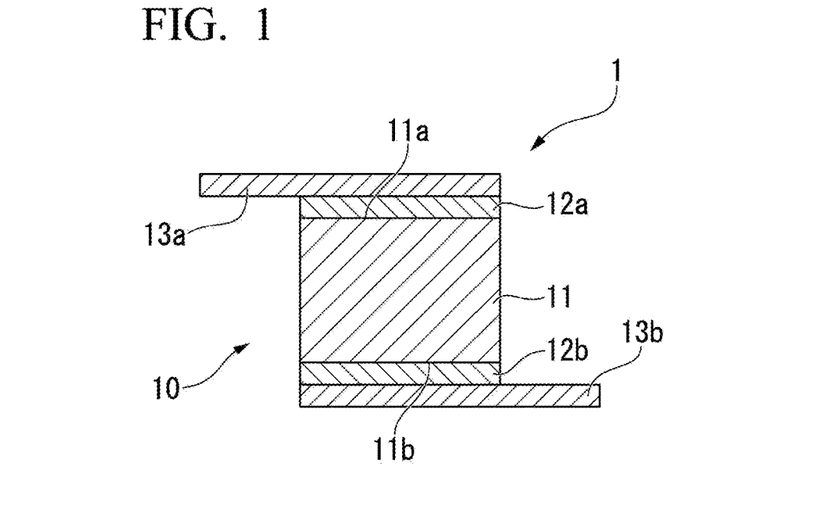
FIG. 1 is a sectional view showing a thermoelectric conversion material according to an embodiment of the present invention, a thermoelectric conversion element using the same, and a thermoelectric conversion module.

FIG. 1 shows a thermoelectric conversion material 11 according to an embodiment of the present invention, a thermoelectric conversion element 10 using the thermoelectric conversion material 11, and a thermoelectric conversion module 1.

The thermoelectric conversion module 1 shown in FIG. 1 includes the thermoelectric conversion material 11 according to the present embodiment, electrodes 12a and 12b respectively formed on one surface 11a of the thermoelectric conversion material 11 and the other surface 11b opposite the one surface, and terminals 13a and 13b respectively connected to the electrodes 12a and 12b.

A part including the thermoelectric conversion material 11 and the electrodes 12a and 12b forms the thermoelectric conversion element 10.

For the electrodes 12a and 12b, nickel, silver, cobalt, tungsten, molybdenum, or the like is used. The electrodes 12a and 12b can be formed by electric sintering, plating, electrodeposition, or the like.

The terminals 13a and 13b are formed of a metal material excellent in conductivity, for example, a plate material such as copper or aluminum. In the present embodiment, a rolled aluminum plate is used. In addition, the electrodes 12a and 12b and the terminals 13a and 13b of the thermoelectric conversion element 10 can be respectively joined together, by Ag brazing, Ag plating, or the like.

The thermoelectric conversion material 11 according to the present embodiment is formed of a sintered body of a magnesium-based compound.

Here, the magnesium-based compound forming the sintered body is preferably one or more selected from a MgSi-based compound, a MgSn-based compound, a MgSiSn-based compound, and a MgSiGe-based compound.

In the present embodiment, the compound forming the sintered body is magnesium silicide ($Mg_2Si$).

The thermoelectric conversion material 11 of the present embodiment is a non-doped thermoelectric conversion material, and has an electric resistance value of $1.0 \times 10^{-4}$ $\Omega \cdot m$ or less in a temperature range of 100° C. or higher and 550° C. or lower. The electric resistance value of the thermoelectric conversion material 11 in a temperature range of 100° C. or higher and 550° C. or lower is preferably $6.0 \times 10^{-5}$ $\Omega \cdot m$ or less.

The lower limit of the electric resistance value of the thermoelectric conversion material 11 in the temperature range of 100° C. or higher and 550° C. or lower is preferably $1.0 \times 10^{-5}$ $\Omega \cdot m$.

In addition, the thermoelectric conversion material 11 according to the present embodiment is an n-type thermoelectric conversion material in which electrons serve as carriers.

Here, "non-doped" means that a dopant of a metal element is not added intentionally.

However, the dopant element such as Sb, Bi, or Al is contained as inevitable impurities, in some cases. In this case, it is preferable that the amount of Sb is less than 0.001 mass %, the amount of Bi is less than 0.001 mass %, and the amount of Al is 0.25 mass % or less. In addition to Sb, Bi, and Al, elements such as Na, K, B, Ga, In, P, As, Cu, and Y are contained as inevitable impurities, in some cases. Also in this case, the amount of each element is preferably 0.01 mass % or less.

In the thermoelectric conversion material 11 according to the present embodiment, the electric resistance value is $1.0 \times 10^{-4}$ $\Omega \cdot m$ or less. Therefore, although the dopant element mixed as an inevitable impurity is very small, the electric resistance value is suppressed sufficiently to be low.

Here, in the present embodiment, the electric resistance value is suppressed to be low by adding a silicon oxide. It is considered that the oxygen constituting the silicon oxide added reacts with Mg in the magnesium-based compound during sintering to form a magnesium oxide, while Si constituting the silicon oxide segregates at a grain boundary of the magnesium-based compound, and forms a dangling bond to reduce the resistance or is diffused into a Mg compound, enters a Mg lattice site, and emits electrons to lower the electric resistance. In the silicon oxide added, unreacted silicon oxide may be contained in the thermoelectric conversion material 11 in some cases.

Hereinafter, an example of a method for manufacturing the thermoelectric conversion material 11 according to the present embodiment described above will be described with reference to FIGS. 2 and 3.

Magnesium-Based Compound Powder Preparing Step S01

Figure 2:
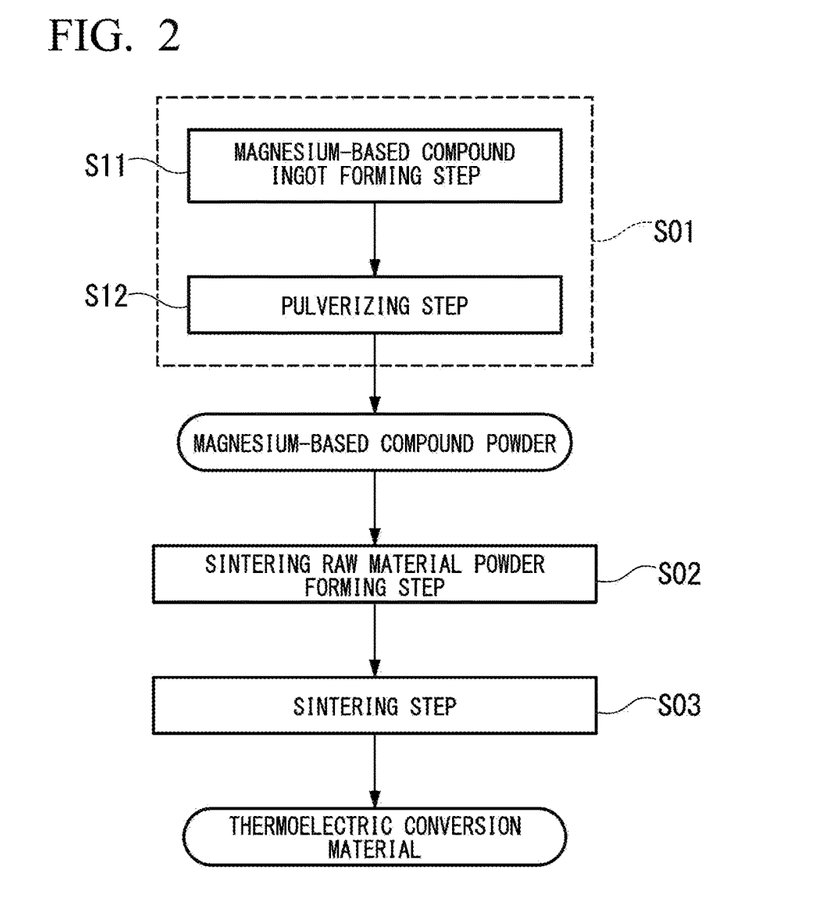
FIG. 2 is a flowchart showing an example of a method for manufacturing a thermoelectric conversion material according to an embodiment of the present invention.

First, a non-doped powder of a magnesium-based compound (magnesium silicide) which is a parent phase of a sintered body which is the thermoelectric conversion material 11, is manufactured.

In the present embodiment, a magnesium-based compound powder preparing step S01 includes a magnesium-based compound ingot forming step S11 for obtaining a non-doped ingot of a magnesium-based compound (magnesium silicide), and a pulverizing step S12 of pulverizing the magnesium-based compound ingot (magnesium silicide) to obtain a magnesium-based compound powder.

In the magnesium-based compound ingot forming step S11, a raw material powder to be melted is weighed and mixed. In the present embodiment, since the magnesium-based compound is the magnesium silicide, the raw material to be melted is silicon particles and magnesium particles.

In the present embodiment, in the silicon particles and the magnesium particles, it is preferable that the content of Sb is less than 0.001 mass %, the content of Bi is less than 0.001 mass %, and the content of Al is 0.25 mass % or less, and is further preferable that the content of each element of Na, K, B, Ga, In, P, As, Cu, and Y is 0.01 mass % or less.

Then, this mixture is charged into a crucible in an atmosphere melting furnace and melted, and then cooled and solidified. Accordingly, an ingot of the magnesium-based compound (magnesium silicide) is manufactured.

Since a small amount of magnesium sublimates during heating, it is preferable to add a large amount of magnesium, for example, approximately 5 at % to a stoichiometric composition of Mg:Si=2:1 when measuring the raw materials.

In the pulverizing step S12, the obtained ingot of the magnesium-based compound (magnesium silicide) is pulverized by a pulverizer to form a magnesium-based compound powder (magnesium silicide powder) (pulverizing step S12).

The average particle size of the magnesium-based compound powder (magnesium silicide powder) is preferably in a range of 0.5 μm or larger and 100 μm or smaller, and further preferably in a range of 1 μm or larger and 75 μm or smaller.

In a case where a commercially available non-doped magnesium-based compound powder (magnesium silicide powder) is used, the magnesium-based compound ingot forming step S11 and the pulverizing step S12 can be omitted.

Sintering Raw Material Powder Forming Step S02

Next, a silicon oxide powder is mixed with the obtained magnesium-based compound powder (magnesium silicide powder) to obtain a sintering raw material powder.

Here, the addition amount of the silicon oxide powder is preferably in a range of 0.1 mass % or more and 10.0 mass % or less, and more preferably in a range of 0.3 mass % or more and 5.0 mass % or less.

In addition, the average particle size of the silicon oxide powder is preferably in a range of 0.1 μm or larger and 100 μm or smaller, and more preferably in a range of 0.5 μm or larger and 50 μm or smaller.

Further, the silicon oxide to be added may be SiOx (X=1 to 2). Further, the silicon oxide to be added may be either amorphous or crystalline.

Sintering Step S03

Next, the sintering raw material powder obtained as described above is heated while applying pressure to obtain a sintered body.

Figure 3:
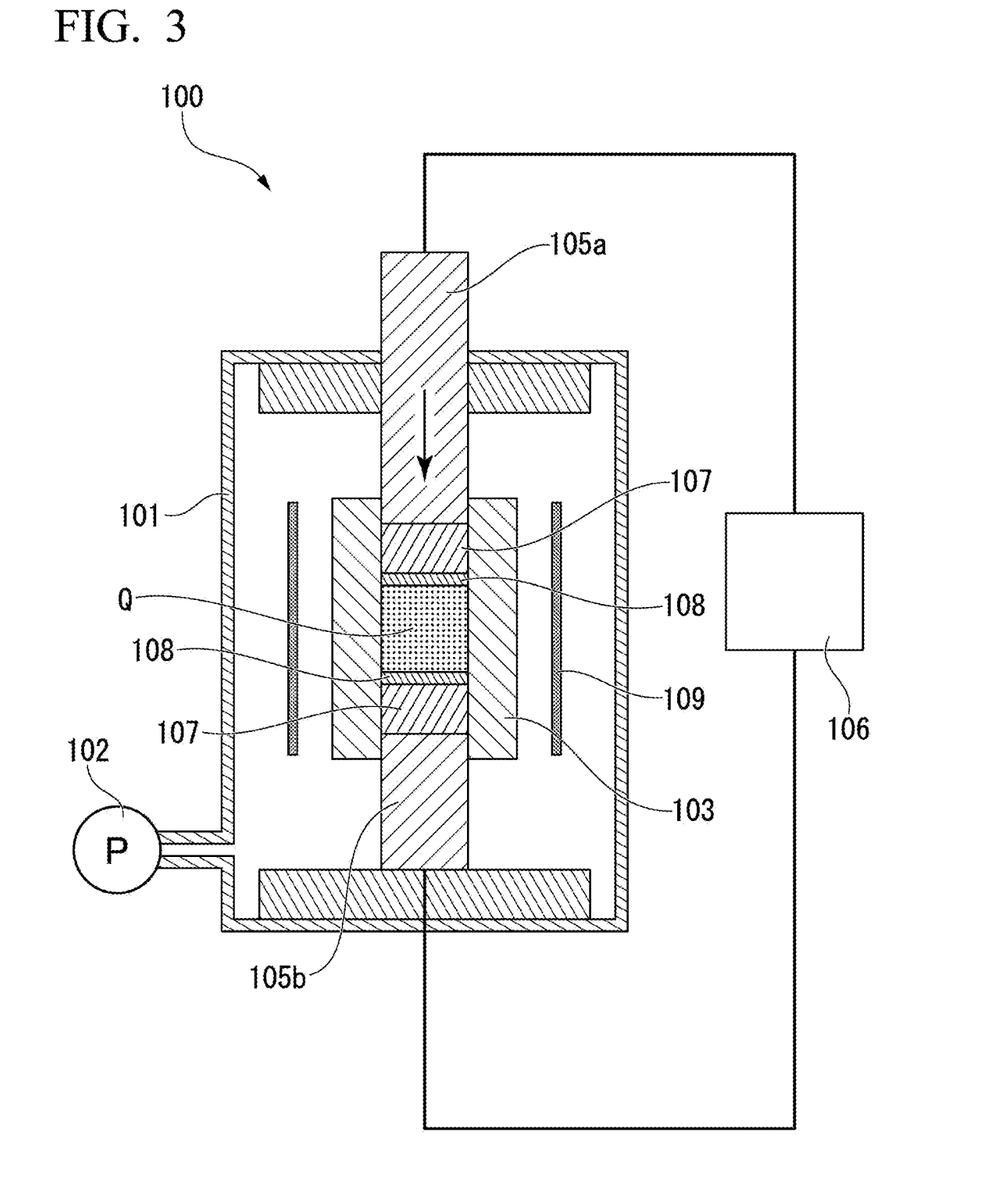
FIG. 3 is a sectional view showing an example of a sintering apparatus used in the method for manufacturing a thermoelectric conversion material shown in FIG. 2.

In the present embodiment, in the sintering step S03, a sintering apparatus (an electric sintering apparatus 100) shown in FIG. 3 is used.

The sintering apparatus (electric sintering apparatus 100) shown in FIG. 3 includes, for example, a pressure-resistant housing 101, a vacuum pump 102 for reducing the pressure inside the pressure-resistant housing 101, and a hollow tubular carbon mold 103 disposed inside the pressure-resistant housing 101, a pair of electrode portions 105a and 105b for applying a current while pressing a sintering raw material powder Q with which the carbon mold 103 is filled, and a power supply device 106 for applying a voltage between the pair of electrode portions 105a and 105b. In addition, a carbon plate 107 and a carbon sheet 108 are respectively provided between the electrode portions 105a and 105b and the sintering raw material powder Q. In addition to these, a thermometer, a displacement gauge, and the like (which are not shown) are provided.

In addition, in the present embodiment, a heater 109 is provided on an outer peripheral side of the carbon mold 103. The heater 109 are disposed on four sides so as to cover the entire outer peripheral side of the carbon mold 103. As the heater 109, a carbon heater, a nichrome wire heater, a molybdenum heater, a Kanthal wire heater, a high frequency heater, or the like can be used.

In a sintering step S03, first, the carbon mold 103 of the electric sintering apparatus 100 shown in FIG. 3 is filled with the sintering raw material powder Q. For example, an inside of the carbon mold 103 is covered with a graphite sheet or a carbon sheet. Then, a direct current is applied between the pair of electrode portions 105a and 105b by using the power supply device 106, and the current is applied to the sintering raw material powder Q. Accordingly, a temperature increases by self-heating (electric heating). In addition, between the pair of electrode portions 105a and 105b, the electrode portion 105a on a movable side is caused to move toward the sintering raw material powder Q, and the sintering raw material powder Q is pressed at a predetermined pressure between the electrode portion 105a and the electrode portion 105b on a fixed side. In addition, the heater 109 is heated.

Accordingly, the sintering raw material powder Q is sintered by the self-heating of the sintering raw material powder Q, the heat from the heater 109, and the pressing.

In the present embodiment, sintering conditions in the sintering step S03 are as follows: a heating temperature of the sintering raw material powder Q is in a range of 850° C. or higher and 1030° C. or lower, and a holding time at the heating temperature is in a range of 0 minutes or longer and 3 minutes or shorter. In addition, pressing load is in a range of 15 MPa or more and 60 MPa or less.

In addition, an atmosphere in the pressure-resistant housing 101 may be an inert atmosphere such as an argon atmosphere or a vacuum atmosphere. When the vacuum atmosphere is set, the pressure may be set to 5 Pa or less.

The lower limit of the heating temperature of the sintering raw material powder is preferably 850° C. or higher. On the other hand, the upper limit of the heating temperature of the sintering raw material powder is preferably 1030° C. or lower.

In addition, the lower limit of the holding time at the heating temperature is preferably 0 minutes or longer. On the other hand, the upper limit of the holding time at the heating temperature is preferably 3 minutes or shorter.

Further, the lower limit of the pressing load is preferably 15 MPa or more. On the other hand, the upper limit of the pressing load is preferably 60 MPa or less.

Thus, in the sintering step S03, when the direct current is applied to the sintering raw material powder Q, polarities of the one electrode portion 105a and the other electrode portion 105b may change at a predetermined time interval. That is, an energizing state in which the one electrode portion 105a is used as an anode and the other electrode portion 105b is used as a cathode, and an energizing state in which the one electrode portion 105a is used as a cathode and the other electrode portion 105b is used as an anode are implemented alternately. In the present embodiment, the predetermined time interval is set within a range of 10 seconds or longer and to 300 seconds or shorter. The predetermined time interval is preferably in a range of 30 seconds or longer and 120 seconds or shorter.

According to the above steps, the thermoelectric conversion material 11 according to the present embodiment is manufactured. As described above, in the silicon particles and the magnesium particles, the amount of Sb is less than 0.001 mass %, the amount of Bi is less than 0.001 mass %, and the amount of Al is 0.25 mass % or less, and the amount of each element of Na, K, B, Ga, In, P, As, Cu, and Y is 0.01 mass % or less, and no dopant is added. Therefore, even in the thermoelectric conversion material including the sintered body of the magnesium-based compound, the amount of Sb is less than 0.001 mass %, the amount of Bi is less than 0.001 mass %, the amount of Al is 0.25 mass % or less, and the amount of each element such as Na, K, B, Ga, In, P, As, Cu, and Y becomes 0.01 mass % or less.

According to the thermoelectric conversion material 11 of the present embodiment configurated described above, the thermoelectric conversion material can be relatively easily manufactured without using the dopant element, in particular, without using Sb, Bi, or Al, which is difficult to handle, as the dopant element.

In addition, since the electric resistance value is suppressed to be low as $1.0 \times 10^{-4}$ Ω·m or less, the power factor (PF) and the dimensionless figure of merit (ZT) increase, and excellent thermoelectric property is obtained.

Further, according to the present embodiment, since the magnesium-based compound forming the thermoelectric conversion material 11 is one or more selected from the MgSi-based compound, the MgSn-based compound, the MgSiSn-based compound, and the MgSiGe-based compound, the thermoelectric conversion material 11 further excellent in the thermoelectric property can be obtained.

In addition, according to the thermoelectric conversion material 11 of the present embodiment, the n-type thermoelectric conversion material can be obtained without intentionally adding the dopant of a metal element such as Sb, Bi, or Al which is difficult to handle.

In addition, according to the method for manufacturing the thermoelectric conversion material according to the present embodiment, the method includes the sintering raw material powder forming step S02 of mixing the silicon oxide powder with the non-doped magnesium-based compound powder (magnesium silicide powder) to obtain a sintering raw material powder, and the sintering step S03 of heating the sintering raw material powder Q while applying pressure to form the sintered body. Therefore, the thermoelectric conversion material 11 according to the present embodiment described above can be manufactured.

Furthermore, in the present embodiment, the electric resistance value of the sintered body of the magnesium-based compound (magnesium silicide) can be suppressed to be low by adding silicon oxide, without adding the dopant element. In addition, since the silicon oxide is a relatively stable substance, it is easy to handle the silicon oxide during manufacturing, and the thermoelectric conversion material 11 can be manufactured efficiently.

The thermoelectric conversion element 10 and the thermoelectric conversion module 1 according to the present embodiment include the thermoelectric conversion material 11 described above, and thus are excellent in the thermoelectric property. Accordingly, it is possible to configure a thermoelectric conversion device excellent in the thermoelectric conversion efficiency.

As described above, the embodiments of the present invention are described. However, the present invention is not limited thereto, and can be appropriately modified without departing from the technical idea of the present invention.

For example, in the present embodiment, it was described that the thermoelectric conversion element and the thermoelectric conversion module having a structure as shown in FIG. 1 are configured. However, the present invention is not limited thereto, and there is no particular limitation on a structure and disposition of the electrodes or terminals, as long as the thermoelectric conversion material of the present embodiment is used.

In addition, in the present embodiment, it was described that the magnesium-based compound forming the sintered body is the magnesium suicide ($Mg_2Si$). However, the present invention is not limited thereto, and a magnesium-based compound having another composition may be used, as long as the compound has a thermoelectric property.

For example, the magnesium-based compound forming the non-doped sintered body may be obtained by adding a predetermined silicon oxide to one or more selected from MgSi-based compound, the MgSn-based compound, the MgSiSn-based compound, and the MgSiGe-based compound.

EXAMPLES

Hereinafter, results of experiments performed to confirm the effects of the present invention will be described.

Mg with a purity of 99.9 mass % (manufactured by Kojundo Chemical Lab. Co., Ltd., granular φ 6 mm×6 mmL) and Si with a purity of 99.999 mass % (manufactured by Kojundo Chemical Lab. Co., Ltd., granular 2 to 5 mm) were weighed. In consideration of deviation from Mg:Si=2:1 of a stoichiometric composition due to sublimation of Mg, Mg was mixed by 5 at % more.

The weighed raw material particles described above were charged into a crucible in an atmosphere melting furnace and melted, and then cooled and solidified. Accordingly, an ingot of the magnesium-based compound (magnesium silicide) was manufactured.

Next, this ingot was pulverized and classified to obtain a non-doped magnesium-based compound powder (magnesium silicide powder) having an average particle size of 30 µm.

In addition, a silicon oxide powder ($SiO_2$ powder) having an average particle size of 15 µm was prepared, and the magnesium silicide powder and the silicon oxide powder were mixed to each other to obtain a sintering raw material powder. In this case, as shown in Table 1, the amount of the silicon oxide powder was adjusted. In a comparative example, no silicon oxide was added.

A carbon mold whose inside was covered with a carbon sheet was filled with the obtained sintering raw material powder. Thus, electric sintering was performed by the sintering apparatus (electric sintering apparatus 100) shown in FIG. 3. The electric sintering conditions were set to atmosphere: vacuum (5 Pa or less), sintering temperature: 940° C., holding time at the sintering temperature: 30 seconds, and pressure load: 40 MPa.

In this manner, the thermoelectric conversion materials of present examples and the comparative example were obtained.

The obtained thermoelectric conversion materials were evaluated for the amount of each of Sb, Bi, Al, Na, K, B, Ga, In, P, As, Cu, and Y, an electric resistance value (R), a Seebeck coefficient (S), a power factor (PF), a thermal conductivity (κ), and a dimensionless figure of merit (ZT).

The amount of each element was measured by high frequency inductively coupled plasma emission spectroscopy using SPS3500 (manufactured by Seiko Instruments Inc.). Table 1 shows evaluation results.

The electric resistance value R and the Seebeck coefficient S were measured by ZEM-3 (manufactured by Advance Riko, Inc.). The measurement was performed at 100° C., 200° C., 300° C., 400° C., 500° C., and 550° C. The power factor (PF) was determined from Equation (1) below.

$$PF = S^2/R \tag{1}$$

S: Seebeck coefficient (V/K), R: Electric resistance value (Ω·m)

The thermal conductivity κ was determined from "thermal diffusivity×density×specific heat capacity". The thermal diffusivity was measured using a thermal constant measuring device (Model TC-7000 manufactured by Vacuum Riko, Inc). The density was measured using an Archimedes method. The specific heat was measured using a differential scanning calorimeter (Model DSC-7 manufactured by Perkin Elmer). The measurement was performed at 100° C., 200° C., 300° C., 400° C., 500° C., and 550° C. The dimensionless figure of merit (ZT) was determined from Equation (2) below.

$$ZT = S^2 \sigma T/\kappa \tag{2}$$

T=Absolute temperature (K), κ=Thermal conductivity (W/(m×K))

Tables 2 to 6 show evaluation results.

TABLE 1

| | | Silicon oxide | | Amount of each element in thermoelectric conversion material (mass %) | | | | | | | | | | | |
| | Kind | Addition amount (mass %) | Sb | Bi | Al | Na | K | B | Ga | In | P | As | Cu | Y |
|---|---|---|---|---|---|---|---|---|---|---|---|---|---|---|
| Present Example 1 | Amorphous $SiO_2$ 15 µm | 1.0 | 0.001 or less | 0.001 or less | 0.11 | 0.001 or less | 0.005 or less | 0.008 | 0.001 or less | 0.004 or less | 0.002 or less | 0.001 or less | 0.002 | 0.0001 or less |
| Present Example 2 | Amorphous $SiO_2$ 15 µm | 3.0 | 0.001 or less | 0.001 or less | 0.11 | 0.001 or less | 0.005 or less | 0.004 | 0.001 or less | 0.004 or less | 0.002 or less | 0.001 or less | 0.002 | 0.0001 or less |
| Present Example 3 | Amorphous $SiO_2$ 15 µm | 3.0 | 0.001 or less | 0.001 or less | 0.12 | 0.001 or less | 0.005 or less | 0.005 | 0.001 or less | 0.004 or less | 0.002 or less | 0.001 or less | 0.003 | 0.0001 or less |
| Present Example 4 | Amorphous $SiO_2$ 15 µm | 5.0 | 0.001 or less | 0.001 or less | 0.10 | 0.001 or less | 0.005 or less | 0.005 | 0.001 or less | 0.004 or less | 0.002 or less | 0.001 or less | 0.002 | 0.0001 or less |
| Present Example 5 | Amorphous $SiO_2$ 25 µm | 1.0 | 0.001 or less | 0.001 or less | 0.09 | 0.001 or less | 0.005 or less | 0.007 | 0.001 or less | 0.004 or less | 0.002 or less | 0.001 or less | 0.004 | 0.0001 or less |

TABLE 1-continued

| | Silicon oxide | | Amount of each element in thermoelectric conversion material (mass %) | | | | | | | | | | |
|---|---|---|---|---|---|---|---|---|---|---|---|---|---|
| | Kind | Addition amount (mass %) | Sb | Bi | Al | Na | K | B | Ga | In | P | As | Cu | Y |
| Present Example 6 | Amorphous SiO$_2$ 4 μm | 1.0 | 0.001 or less | 0.001 or less | 0.08 | 0.001 or less | 0.005 or less | 0.003 | 0.001 or less | 0.004 or less | 0.002 or less | 0.001 or less | 0.002 | 0.0001 or less |
| Present Example 7 | SiO$_2$ 38 μm | 2.0 | 0.001 or less | 0.001 or less | 0.21 | 0.001 or less | 0.005 or less | 0.007 | 0.001 or less | 0.004 or less | 0.002 or less | 0.001 or less | 0.004 | 0.0001 or less |
| Present Example 8 | Amorphous SiO$_2$ 15 μm | 0.5 | 0.001 or less | 0.001 or less | 0.06 | 0.001 or less | 0.005 or less | 0.002 | 0.001 or less | 0.004 or less | 0.002 or less | 0.001 or less | 0.002 | 0.0001 or less |
| Present Example 9 | Amorphous SiO$_2$ 15 μm | 0.1 | 0.001 or less | 0.001 or less | 0.01 | 0.001 or less | 0.005 or less | 0.001 | 0.001 or less | 0.004 or less | 0.002 or less | 0.001 or less | 0.001 | 0.0001 or less |
| Present Example 10 | Amorphous SiO$_2$ 15 μm | 10.0 | 0.001 or less | 0.001 or less | 0.24 | 0.001 or less | 0.005 or less | 0.009 | 0.001 or less | 0.004 or less | 0.002 or less | 0.001 or less | 0.005 | 0.0001 or less |
| Comparative Example | — | 0.0 | 0.001 or less | 0.001 or less | 0.12 | 0.001 or less | 0.005 or less | 0.005 | 0.001 or less | 0.004 or less | 0.002 or less | 0.001 or less | 0.003 | 0.0001 or less |

TABLE 2

| | Electric resistance value (Ω · m) | | | | | |
|---|---|---|---|---|---|---|
| | 100° C. | 200° C. | 300° C. | 400° C. | 500° C. | 550° C. |
| Present Example 1 | $2.18 \times 10^{-5}$ | $2.58 \times 10^{-5}$ | $3.26 \times 10^{-5}$ | $4.05 \times 10^{-5}$ | $4.57 \times 10^{-5}$ | $4.69 \times 10^{-5}$ |
| Present Example 2 | $2.87 \times 10^{-5}$ | $3.35 \times 10^{-5}$ | $4.26 \times 10^{-5}$ | $5.25 \times 10^{-5}$ | $5.89 \times 10^{-5}$ | $5.96 \times 10^{-5}$ |
| Present Example 3 | $2.76 \times 10^{-5}$ | $3.23 \times 10^{-5}$ | $4.04 \times 10^{-5}$ | $5.06 \times 10^{-5}$ | $5.59 \times 10^{-5}$ | $5.66 \times 10^{-5}$ |
| Present Example 4 | $2.52 \times 10^{-5}$ | $2.93 \times 10^{-5}$ | $3.66 \times 10^{-5}$ | $4.58 \times 10^{-5}$ | $5.23 \times 10^{-5}$ | $5.32 \times 10^{-5}$ |
| Present Example 5 | $1.85 \times 10^{-5}$ | $2.23 \times 10^{-5}$ | $2.78 \times 10^{-5}$ | $3.45 \times 10^{-5}$ | $3.99 \times 10^{-5}$ | $4.20 \times 10^{-5}$ |
| Present Example 6 | $2.32 \times 10^{-5}$ | $2.83 \times 10^{-5}$ | $3.41 \times 10^{-5}$ | $4.26 \times 10^{-5}$ | $4.97 \times 10^{-5}$ | $5.48 \times 10^{-5}$ |
| Present Example 7 | $2.57 \times 10^{-5}$ | $3.03 \times 10^{-5}$ | $3.86 \times 10^{-5}$ | $4.51 \times 10^{-5}$ | $5.02 \times 10^{-5}$ | $5.33 \times 10^{-5}$ |
| Present Example 8 | $1.65 \times 10^{-5}$ | $2.09 \times 10^{-5}$ | $2.69 \times 10^{-5}$ | $3.45 \times 10^{-5}$ | $4.03 \times 10^{-5}$ | $4.23 \times 10^{-5}$ |
| Present Example 9 | $2.49 \times 10^{-5}$ | $2.56 \times 10^{-5}$ | $3.11 \times 10^{-5}$ | $3.81 \times 10^{-5}$ | $4.49 \times 10^{-5}$ | $5.26 \times 10^{-5}$ |
| Present Example 10 | $3.54 \times 10^{-5}$ | $4.00 \times 10^{-5}$ | $4.81 \times 10^{-5}$ | $5.30 \times 10^{-5}$ | $5.89 \times 10^{-5}$ | $6.47 \times 10^{-5}$ |
| Comparative Example | $2.79 \times 10^{4}$ | — | — | — | $2.76 \times 10^{4}$ | $2.75 \times 10^{4}$ |

TABLE 3

| | Seebeck coefficient S (V/K) | | | | | |
|---|---|---|---|---|---|---|
| | 100° C. | 200° C. | 300° C. | 400° C. | 500° C. | 550° C. |
| Present Example 1 | $-2.34 \times 10^{-4}$ | $-2.52 \times 10^{-4}$ | $-2.71 \times 10^{-4}$ | $-2.91 \times 10^{-4}$ | $-2.98 \times 10^{-4}$ | $-2.92 \times 10^{-4}$ |
| Present Example 2 | $-2.24 \times 10^{-4}$ | $-2.51 \times 10^{-4}$ | $-2.73 \times 10^{-4}$ | $-2.93 \times 10^{-4}$ | $-2.96 \times 10^{-4}$ | $-2.90 \times 10^{-4}$ |
| Present Example 3 | $-2.30 \times 10^{-4}$ | $-2.59 \times 10^{-4}$ | $-2.83 \times 10^{-4}$ | $-3.01 \times 10^{-4}$ | $-3.03 \times 10^{-4}$ | $-2.93 \times 10^{-4}$ |
| Present Example 4 | $-2.17 \times 10^{-4}$ | $-2.40 \times 10^{-4}$ | $-2.64 \times 10^{-4}$ | $-2.84 \times 10^{-4}$ | $-2.89 \times 10^{-4}$ | $-2.82 \times 10^{-4}$ |
| Present Example 5 | $-2.22 \times 10^{-4}$ | $-2.51 \times 10^{-4}$ | $-2.70 \times 10^{-4}$ | $-2.91 \times 10^{-4}$ | $-2.99 \times 10^{-4}$ | $-2.90 \times 10^{-4}$ |
| Present Example 6 | $-2.32 \times 10^{-4}$ | $-2.53 \times 10^{-4}$ | $-2.73 \times 10^{-4}$ | $-2.96 \times 10^{-4}$ | $-2.97 \times 10^{-4}$ | $-2.93 \times 10^{-4}$ |
| Present Example 7 | $-2.31 \times 10^{-4}$ | $-2.57 \times 10^{-4}$ | $-2.75 \times 10^{-4}$ | $-2.99 \times 10^{-4}$ | $-2.96 \times 10^{-4}$ | $-2.91 \times 10^{-4}$ |
| Present Example 8 | $-2.04 \times 10^{-4}$ | $-2.03 \times 10^{-4}$ | $-2.55 \times 10^{-4}$ | $-2.78 \times 10^{-4}$ | $-2.86 \times 10^{-4}$ | $-2.84 \times 10^{-4}$ |

TABLE 3-continued

| | Seebeck coefficient S (V/K) | | | | | |
|---|---|---|---|---|---|---|
| | 100° C. | 200° C. | 300° C. | 400° C. | 500° C. | 550° C. |
| Present Example 9 | $-2.21 \times 10^{-4}$ | $-2.35 \times 10^{-4}$ | $-2.68 \times 10^{-4}$ | $-2.83 \times 10^{-4}$ | $-2.93 \times 10^{-4}$ | $-2.99 \times 10^{-4}$ |
| Present Example 10 | $-2.51 \times 10^{-4}$ | $-2.71 \times 10^{-4}$ | $-2.86 \times 10^{-4}$ | $-2.97 \times 10^{-4}$ | $-3.12 \times 10^{-4}$ | $-3.31 \times 10^{-4}$ |
| Comparative Example | $2.29 \times 10^{-2}$ | — | $-3.55 \times 10^{-3}$ | — | $5.92 \times 10^{-2}$ | $-6.14 \times 10^{-3}$ |

TABLE 4

| | PF (W/(m·K²)) | | | | | |
|---|---|---|---|---|---|---|
| | 100° C. | 200° C. | 300° C. | 400° C. | 500° C. | 550° C. |
| Present Example 1 | $2.51 \times 10^{-3}$ | $2.43 \times 10^{-3}$ | $2.26 \times 10^{-3}$ | $2.09 \times 10^{-3}$ | $1.94 \times 10^{-3}$ | $1.81 \times 10^{-3}$ |
| Present Example 2 | $1.75 \times 10^{-3}$ | $1.88 \times 10^{-3}$ | $1.75 \times 10^{-3}$ | $1.63 \times 10^{-3}$ | $1.48 \times 10^{-3}$ | $1.41 \times 10^{-3}$ |
| Present Example 3 | $1.92 \times 10^{-3}$ | $2.07 \times 10^{-3}$ | $1.98 \times 10^{-3}$ | $1.79 \times 10^{-3}$ | $1.64 \times 10^{-3}$ | $1.52 \times 10^{-3}$ |
| Present Example 4 | $1.86 \times 10^{-3}$ | $1.96 \times 10^{-3}$ | $1.90 \times 10^{-3}$ | $1.76 \times 10^{-3}$ | $1.60 \times 10^{-3}$ | $1.50 \times 10^{-3}$ |
| Present Example 5 | $2.66 \times 10^{-3}$ | $2.83 \times 10^{-3}$ | $2.62 \times 10^{-3}$ | $2.45 \times 10^{-3}$ | $2.24 \times 10^{-3}$ | $2.00 \times 10^{-3}$ |
| Present Example 6 | $2.32 \times 10^{-3}$ | $2.26 \times 10^{-3}$ | $2.19 \times 10^{-3}$ | $2.06 \times 10^{-3}$ | $1.77 \times 10^{-3}$ | $1.57 \times 10^{-3}$ |
| Present Example 7 | $2.08 \times 10^{-3}$ | $2.18 \times 10^{-3}$ | $1.96 \times 10^{-3}$ | $1.98 \times 10^{-3}$ | $1.75 \times 10^{-3}$ | $1.59 \times 10^{-3}$ |
| Present Example 8 | $2.54 \times 10^{-3}$ | $2.52 \times 10^{-3}$ | $2.43 \times 10^{-3}$ | $2.22 \times 10^{-3}$ | $2.03 \times 10^{-3}$ | $1.91 \times 10^{-3}$ |
| Present Example 9 | $1.96 \times 10^{-3}$ | $2.16 \times 10^{-3}$ | $2.31 \times 10^{-3}$ | $2.10 \times 10^{-3}$ | $1.91 \times 10^{-3}$ | $1.70 \times 10^{-3}$ |
| Present Example 10 | $1.77 \times 10^{-3}$ | $1.83 \times 10^{-3}$ | $1.70 \times 10^{-3}$ | $1.66 \times 10^{-3}$ | $1.65 \times 10^{-3}$ | $1.69 \times 10^{-3}$ |
| Comparative Example | $1.87 \times 10^{-8}$ | — | — | — | $1.27 \times 10^{-7}$ | $1.37 \times 10^{-9}$ |

TABLE 5

| | Thermal conductivity κ (W/(m·K)) | | | | | |
|---|---|---|---|---|---|---|
| | 100° C. | 200° C. | 300° C. | 400° C. | 500° C. | 550° C. |
| Present Example 1 | 8.24 | 6.29 | 4.96 | 4.29 | 4.13 | 4.02 |
| Present Example 2 | 8.90 | 6.85 | 5.45 | 4.90 | 4.72 | 4.55 |
| Present Example 3 | 8.71 | 6.93 | 5.60 | 5.07 | 4.89 | 4.65 |
| Present Example 4 | 9.38 | 7.46 | 5.87 | 5.25 | 4.97 | 4.76 |
| Present Example 5 | 8.33 | 6.55 | 5.00 | 4.43 | 4.19 | 4.00 |
| Present Example 6 | 8.37 | 6.63 | 5.21 | 4.57 | 4.30 | 4.07 |
| Present Example 7 | 8.45 | 6.50 | 5.18 | 4.43 | 4.27 | 4.20 |
| Present Example 8 | 9.06 | 7.06 | 5.59 | 5.00 | 4.81 | 4.68 |
| Present Example 9 | 8.53 | 6.63 | 5.27 | 4.76 | 4.58 | 4.39 |
| Present Example 10 | 9.51 | 7.35 | 6.37 | 5.92 | 5.76 | 5.43 |
| Comparative Example | 8.98 | 7.01 | 5.67 | 5.05 | 4.88 | 4.84 |

TABLE 6

| | Dimensionless figure of merit ZT | | | | | |
|---|---|---|---|---|---|---|
| | 100° C. | 200° C. | 300° C. | 400° C. | 500° C. | 550° C. |
| Present Example 1 | 0.110 | 0.190 | 0.280 | 0.350 | 0.380 | 0.390 |
| Present Example 2 | 0.070 | 0.130 | 0.180 | 0.220 | 0.240 | 0.260 |
| Present Example 3 | 0.080 | 0.140 | 0.200 | 0.240 | 0.260 | 0.270 |
| Present Example 4 | 0.080 | 0.130 | 0.190 | 0.230 | 0.260 | 0.260 |
| Present Example 5 | 0.120 | 0.200 | 0.300 | 0.370 | 0.410 | 0.410 |
| Present Example 6 | 0.100 | 0.160 | 0.240 | 0.300 | 0.320 | 0.320 |
| Present Example 7 | 0.090 | 0.160 | 0.220 | 0.300 | 0.320 | 0.310 |
| Present Example 8 | 0.100 | 0.170 | 0.250 | 0.300 | 0.330 | 0.340 |
| Present Example 9 | 0.090 | 0.150 | 0.250 | 0.300 | 0.320 | 0.260 |
| Present Example 10 | 0.070 | 0.120 | 0.150 | 0.190 | 0.220 | 0.260 |
| Comparative Example | 0.041 | 0.060 | 0.075 | 0.074 | 0.062 | 0.059 |

In the comparative example in which no silicon oxide was added, no dopant element was contained, and the electric resistance value R was very high. In addition, it is confirmed that the value of the Seebeck coefficient S is relatively unstable, the power factor (PF) is low, the dimensionless figure of merit ZT is also low, and the thermoelectric property is inferior.

In the present examples to which a silicon oxide was added, the electric resistance value R was sufficiently low even without containing a dopant element. In addition, it is confirmed that the Seebeck coefficient S is stable, the power factor (PF) is also sufficiently high, the dimensionless figure of merit ZT is sufficiently high, and the thermoelectric property is excellent.

From the above, it was confirmed that, according to the present examples, it is possible to provide a thermoelectric conversion material that can suppress an electric resistance value to be low without adding a dopant element complicated to handle and is excellent in a thermoelectric property.

What is claimed is:

1. A thermoelectric conversion material consisting of:
a non-doped sintered body of a magnesium-based compound,
wherein an electric resistance value is $1.0 \times 10^{-4}$ Ω·m or less,
the magnesium-based compound contains 0.1 mass % or more and 10.0 mass % or less of silicon oxide, and
the magnesium-based compound is one or more selected from a MgSi-based compound, a MgSn-based compound, a MgSiSn-based compound, and a MgSiGe-based compound.

2. The thermoelectric conversion material according to claim 1,
wherein the thermoelectric conversion material is n-type.

3. The thermoelectric conversion material according to claim 1,
wherein the magnesium-based compound is one or more selected from a MgSi-based compound, a MgSn-based compound, and a MgSiGe-based compound.

4. The thermoelectric conversion material according to claim 1,
wherein the magnesium-based compound is a sintered body of a sintering raw material containing silicon oxide powder and non-doped magnesium-based compound powder.

5. A thermoelectric conversion element comprising:
the thermoelectric conversion material according to claim 1; and
electrodes respectively joined to one surface of the thermoelectric conversion material and the other surface opposite the one surface.

6. A thermoelectric conversion module comprising:
the thermoelectric conversion element according to claim 5; and
terminals respectively joined to the electrodes of the thermoelectric conversion element.

7. A method for manufacturing the thermoelectric conversion material according to claim 1, the method comprising:
a sintering raw material powder forming step of mixing a silicon oxide powder with a non-doped magnesium-based compound powder to obtain a sintering raw material powder; and
a sintering step of heating the sintering raw material powder while applying pressure to form a sintered body.

8. The method for manufacturing the thermoelectric conversion material according to claim 7,
wherein an addition amount of the silicon oxide powder in the sintering raw material powder forming step is in a range of 0.1 mass % or more and 10.0 mass % or less.

* * * * *